United States Patent
Chino (10) Patent No.: US 9,293,406 B2
(45) Date of Patent: Mar. 22, 2016

(54) SEMICONDUCTOR PACKAGE AND MANUFACTURING METHOD THEREOF

(71) Applicant: SHINKO ELECTRIC INDUSTRIES CO., LTD., Nagano-shi, Nagano (JP)

(72) Inventor: Yukari Chino, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 79 days.

(21) Appl. No.: 13/910,530

(22) Filed: Jun. 5, 2013

(65) Prior Publication Data
US 2013/0328212 A1    Dec. 12, 2013

(30) Foreign Application Priority Data
Jun. 8, 2012    (JP) .................................. 2012-131346

(51) Int. Cl.
| H01L 23/48 | (2006.01) |
| H01L 23/498 | (2006.01) |
| H01L 23/00 | (2006.01) |
| H01L 21/56 | (2006.01) |
| H01L 23/538 | (2006.01) |

(52) U.S. Cl.
CPC ........ *H01L 23/49827* (2013.01); *H01L 21/568* (2013.01); *H01L 23/5389* (2013.01); *H01L 24/19* (2013.01); *H01L 23/49816* (2013.01); *H01L 2224/0401* (2013.01); *H01L 2224/04105* (2013.01); *H01L 2224/12105* (2013.01); *H01L 2924/12042* (2013.01); *H01L 2924/18162* (2013.01); *H01L 2924/351* (2013.01)

(58) Field of Classification Search
CPC .................................. H01L 23/49827
USPC ........................................... 257/774
See application file for complete search history.

(56) References Cited

U.S. PATENT DOCUMENTS

| 6,256,875 B1 * | 7/2001 | Watanabe et al. ................ 29/830 |
| 2004/0168825 A1 * | 9/2004 | Sakamoto et al. ............. 174/260 |
| 2008/0099912 A1 * | 5/2008 | Wu ................................ 257/737 |

FOREIGN PATENT DOCUMENTS

JP    2008-300854 A    12/2008

* cited by examiner

*Primary Examiner* — Theresa T Doan
(74) *Attorney, Agent, or Firm* — Drinker Biddle & Reath LLP (57) ABSTRACT

A semiconductor package includes: a semiconductor chip: a first insulating layer, wherein the semiconductor chip is embedded in the first insulating layer such that the first surface and the side surface of the semiconductor chip are covered by the first insulating layer; a wiring structure on the first surface of the first insulating layer and comprising an insulating layer and a wiring layer; an outermost wiring layer on the wiring structure and having: a reinforcing wiring pattern; and a via wiring which penetrates the reinforcing wiring pattern and electrically connected to the reinforcing wiring pattern, wherein the via wiring is formed through the insulating layer of the wiring structure and electrically connected to the wiring layer of the wiring structure; a second insulating layer on the wiring structure to cover the outermost wiring layer.

10 Claims, 8 Drawing Sheets

SEMICONDUCTOR PACKAGE 10C

TOP VIEW

SEMICONDUCTOR PACKAGE 10D

TOP VIEW

SECTION VIEW

SECTION VIEW

SEMICONDUCTOR PACKAGE AND MANUFACTURING METHOD THEREOF

This application claims priority from Japanese Patent Application No. 2012-131346, filed on Jun. 8, 2012, the entire contents of which are herein incorporated by reference.

BACKGROUND

1. Technical Field

The present disclosure relates to a semiconductor package in which a semiconductor chip is embedded and a manufacturing method thereof.

2. Description of the Related Art

In the related art, a semiconductor package in which a semiconductor chip is embedded has been proposed. For example, the semiconductor package includes a first insulating layer which is formed to cover a circuit forming surface (a surface on which an electrode pad is provided) and a side surface of the semiconductor chip. Moreover, a first wiring layer which is electrically connected to the electrode pad of the semiconductor chip and other insulating layers or wiring layers which are formed on the first wiring layer are provided on the first insulating layer (see e.g., JP-A-2008-300854).

However, in the related-art the semiconductor package, the semiconductor chip is embedded in one side of the first insulating layer in a thickness direction, and a multilayer wiring structure including the insulating layer and the wiring layer is formed on the other side of the first insulating layer. As such, the semiconductor chip is not embedded in the other side. With this configuration, a warpage occurs in the related-art semiconductor package.

More specifically, when the semiconductor chip contains silicon as a main component, the thermal expansion coefficient is substantially 3.4 ppm/° C., and Young's modulus is substantially 200 GPa. On the other hand, the first insulating layer or other insulating layers contain epoxy resin as a main component, the thermal expansion coefficient is substantially 8 ppm/° C. to 150 ppm/° C., and Young's modulus is substantially 0.03 GPa to 13 GPa. In addition, when the first wiring layer or other wiring layers contain copper as a main component, the thermal expansion coefficient is substantially 17.2 ppm/° C., and Young's modulus is substantially 118 GPa.

Due to differences in the physical property values (thermal expansion coefficient or Young' modulus), the first insulating layer side (one side of the semiconductor package) in which the semiconductor chip is embedded is not easily deformed by thermal stress or the like, but the other side in which the semiconductor is not embedded is easily deformed by thermal stress or the like. As a result, for example, in the semiconductor package, there is a problem that a warpage occurs and the first insulating layer side, in which the semiconductor chip is embedded, tends to be deformed in a convex shape.

SUMMARY OF THE INVENTION

According to one or more aspects of the present embodiment, there is provided a semiconductor package comprising: a semiconductor chip comprising: a first surface on which a first electrode pad is provided; a second surface opposite to the first surface; and a side surface between the first surface and the second surface, a first insulating layer comprising a first surface and a second surface opposite to the first surface, wherein the semiconductor chip is embedded in the first insulating layer such that the first surface and the side surface of the semiconductor chip are covered by the first insulating layer; a wiring structure on the first surface of the first insulating layer and comprising an insulating layer and a wiring layer; an outermost wiring layer on the wiring structure and comprising: a reinforcing wiring pattern; and a via wiring which penetrates the reinforcing wiring pattern and electrically connected to the reinforcing wiring pattern, wherein the via wiring is formed through the insulating layer of the wiring structure and electrically connected to the wiring layer of the wiring structure; a second insulating layer on the wiring structure to cover the outermost wiring layer. A thermal expansion coefficient of a main component of the reinforcing wiring pattern is between a thermal expansion coefficient of a main component of the wiring layer of the wiring structure and a thermal expansion coefficient of a main component of the semiconductor chip.

DETAILED DESCRIPTION

Hereinafter, exemplary embodiments of the present invention will be now described with reference to the drawings. In each drawing, the same reference numeral is attached to the same component, and the overlapped descriptions may be omitted.

First Embodiment

Figure 1:
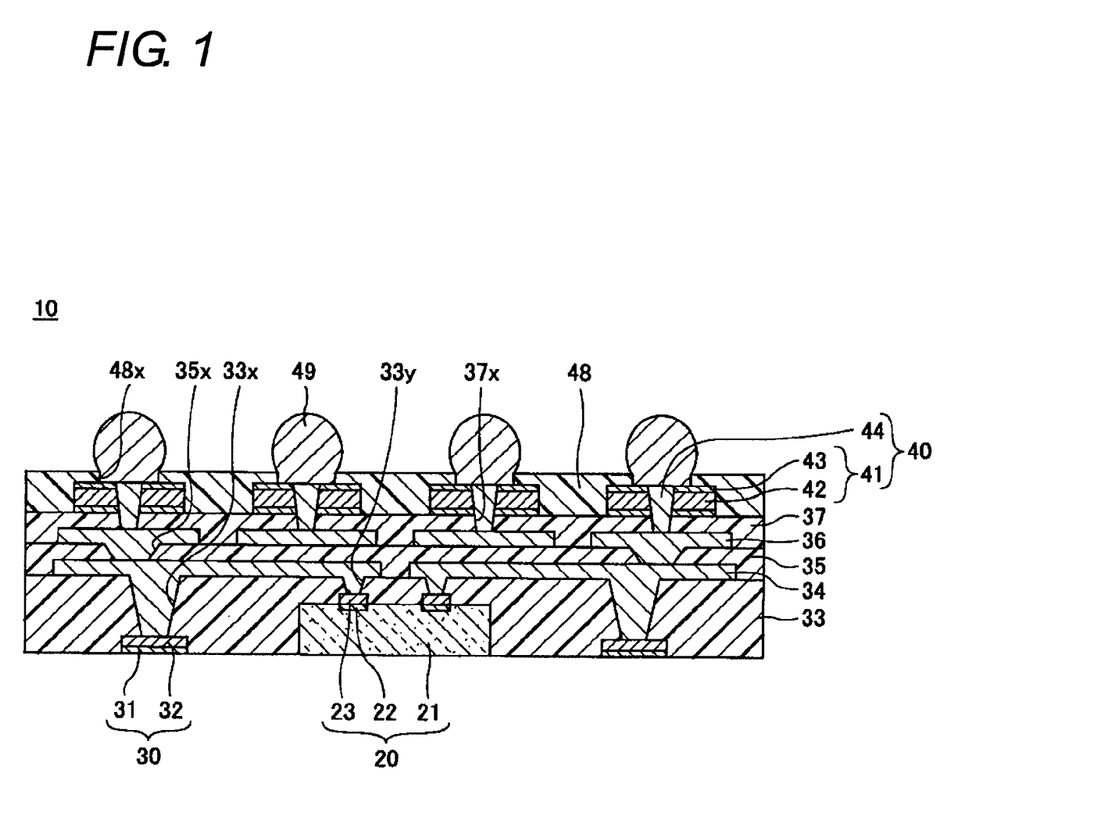
FIG. 1 is a cross-sectional view showing a semiconductor package according to a first embodiment.

FIG. 1 is a cross-sectional view showing a semiconductor package according to a first embodiment. Referring to FIG. 1, the semiconductor package 10 includes a semiconductor chip 20, a wiring layer 30, an insulating layer 33, a wiring layer 34, an insulating layer 35, a wiring layer 36, and insulating layer 37, a wiring layer 40, a solder-resist layer 48, and an external connection terminal 49.

Moreover, in the semiconductor package 10, for convenience, the insulating layer 33 side is set to a lower portion (lower surface) and the solder-resist layer 48 side is set to an upper portion (upper surface) in FIG. 1.

For example, the planar shape of the semiconductor package 10 is a rectangular shape. For example, the dimensions may be substantially the width of 12 mm×the depth of 12 mm×the thickness of 0.4 mm. Hereinafter, the semiconductor chip 20 will be described in detail.

The semiconductor chip 20 includes a semiconductor substrate 21, an electrode pad 22, and a projection electrode 23. For example, the planar shape of the semiconductor chip 20 is a rectangular shape, and for example, the dimensions may be substantially the width of 8 mm×the depth of 8 mm×the thickness of 75 μm.

For example, in the semiconductor substrate 21, a semiconductor integrated circuit (not shown) is formed on a substrate which contains silicon (Si) as a main component. The electrode pad 22 is formed on a circuit forming surface of the semiconductor substrate 21 and is electrically connected to the semiconductor integrated circuit (not shown). For example, as a material of the electrode pad 22, aluminum (Al) or the like may be used. A material in which copper (Cu) and aluminum (Al) are formed in the order may be used as the material of the electrode pad 22. Alternatively, a material in which copper (Cu), aluminum (Al), and silicon (Si) are formed in the order may be used as the material of the electrode pad 22.

The projection electrode 23 is formed on the electrode pad 22. For example, as the projection electrode 23, a cylindrical shaped copper (Cu) post or the like may be used. For example, the diameter of the projection electrode 23 is substantially 50 μm. For example, the height of the projection electrode 23 may be substantially 5 μm to 10 μm. For example, the pitch of the projection electrodes 23 adjacent to each other may be substantially 100 μm. The projection electrode 23 may not be provided on the electrode pad 22. For example, the electrode pad 22 serves as an electrode which is electrically connected to the wiring layer 34.

Hereinafter, a surface of the semiconductor chip 20, which is substantially parallel to and opposite to the circuit forming surface of the semiconductor chip 20, is referred to as a rear surface. A surface of the semiconductor chip 20, which is substantially perpendicular to the circuit forming surface and the rear surface, is referred to as a side surface.

The circuit forming surface and the side surface of the semiconductor chip 20 are covered by the insulating layer 33, and the rear surface of the semiconductor chip 20 is exposed from the insulating layer 33. The rear surface of the semiconductor chip 20 is substantially flush with the lower surface of the insulating layer 33. In a manufacturing process of the semiconductor package 10, a adhesion layer such as a die attach film, which is attached to the rear surface of the semiconductor chip 20, is removed by plasma treatment or the like.

Meanwhile, in the manufacturing process of the semiconductor package 10, the adhesion layer attached to the rear surface of the semiconductor chip 20 may not be removed. In this case, the adhesion layer attached to the rear surface of the semiconductor chip 20 is exposed from the lower surface of the insulating layer 33. However, since the thickness of the adhesion layer is substantially several tens micron, it can be said that the rear surface of the semiconductor chip 20 is substantially flush with the lower surface of the insulating layer 33.

The wiring layer 30 includes a first layer 31 and a second layer 32 formed on the first layer 31. For example, as the first layer 31, a conductive layer may be used in which a gold (Au) film, a palladium (Pd) film, and a nickel (Ni) film are sequentially laminated in the order, wherein the gold (Au) film is exposed to the outside of the semiconductor package 10. For example, as the first layer 31, a conductive layer may be also used in which a gold (Au) film and a nickel (Ni) film are sequentially laminated in the order, wherein the gold (Au) film is exposed to the outside of the semiconductor package 10. For example, as the second layer 32, a conductive layer, which includes a copper (Cu) layer or the like, may be used. For example, the thickness of the wiring layer 30 may be substantially 10 μm to 20 μm.

A portion (the lower surface of the first layer 31) of the wiring layer 30 is exposed from the insulating layer 33, and the lower surface of the insulating layer 33 and the rear surface of the semiconductor chip 20 are substantially flush with each other. A portion (the lower surface of the first layer 31) of the wiring layer 30 serves as an electrode pad which is electrically connected to another semiconductor package, semiconductor chip or electronic component (not shown). Hereinafter, the wiring layer 30 which is exposed from the insulating layer 33 may be referred to as a first electrode pad 30.

In addition, in FIG. 1, the number of the first electrode pads 30 is reduced to simplify the drawing. However, actually, for example, a plurality of rows of first electrode pads 30 are provided to surround the rear surface of the semiconductor chip 20 in a frame shape when viewed from a plan view. For example, the planar shape of the first electrode pad 30 is circular, and for example, the diameter may be substantially 100 μm to 350 μm. For example, the pitch of the adjacent first electrode pads 30 may be substantially 400 μm to 500 μm.

The insulating layer 33 is formed to cover the upper surface and the side surface of the wiring layer 30 and the circuit forming surface and the side surface of the semiconductor chip 20 while exposing the lower surface of the wiring layer 30 and the rear surface (or the adhesion layer attached to the rear surface) of the semiconductor chip 20. In addition, the insulating layer 33 is a representative example of a first outermost insulating layer according to the present invention.

For example, as a material of the insulating layer 33, thermosetting insulating resin, which contains epoxy resin, phenolic resin as a main component, may be used. For example, the thickness of the insulating layer 33 may be substantially 120 μm. The insulating layer 33 may contain filler such as silica ($SiO_2$). Moreover, the upper surface (the surface side of the circuit forming surface of the semiconductor chip 20) of the insulating layer 33 may be referred to as a first surface, and the surface (the rear surface side of the semiconductor chip 20) opposite to the first surface may be referred to as a second surface.

In the insulating layer 33, a via hole 33x which penetrates the insulating layer 33 and exposes the upper surface of the wiring layer 30 and a via hole 33y which penetrates the insulating layer 33 and exposes the upper surface of the projection electrode 23 are formed. The via hole 33x becomes a truncated cone shaped concave portion such that the diameter of an opening portion at the insulating layer 35 side is larger than the diameter of an opening portion at the upper surface of the wiring layer 30. For example, the diameter of the opening portion of the via hole 33x may be substantially 150 μm.

The via hole 33y becomes a truncated cone shaped concave portion such that the diameter of an opening portion at the insulating layer 35 side is larger than the diameter of an opening portion at the upper surface of the projection electrode 23. For example, the diameter of the opening portion of the via hole 33y may be substantially 30 μm.

The wiring layer 34 is formed on the insulating layer 33. The wiring layer 34 includes a via wiring filled in the via hole 33x, a via wiring filled in the via hole 33y, and a wiring pattern formed on the insulating layer 33. The wiring layer 34 is electrically connected to the wiring layer 30 exposed at the bottom portion of the via hole 33x and the projection electrode 23 exposed at the bottom portion of the via hole 33y. For example, as a material of the wiring layer 34, copper (Cu) or the like may be used. For example, the thickness of the wiring pattern of the wiring layer 34 may be substantially 10 μm to 20 μm.

The insulating layer 35 is formed to cover the wiring layer 34 on the insulating layer 33. As a material of the insulating layer 35, similar to the insulating layer 33, insulating resin may be used. For example, the thickness of the insulating layer 35 may be substantially 15 μm to 60 μm. The insulating layer 35 may include filler such as silica ($SiO_2$).

The wiring layer 36 is formed on the insulating layer 35. The wiring layer 36 includes a via wiring filled in a via hole 35x which penetrates the insulating layer 35 and exposes the upper surface of the wiring layer 34, and a wiring pattern formed on the insulating layer 35. The via hole 35x becomes a truncated cone shaped concave portion such that the diameter of an opening portion at the insulating layer 37 side is larger than the diameter of an opening portion at the upper surface of the wiring layer 34.

The wiring layer 36 is electrically connected to the wiring layer 34 which is exposed at the bottom portion of the via hole 35x. For example, as a material of the wiring layer 36, copper (Cu) or the like may be used. For example, the thickness of the wiring pattern of the wiring layer 36 may be substantially 10 μm to 20 μm.

The insulating layer 37 is formed to cover the wiring layer 36 on the insulating layer 35. As a material of the insulating layer 37, similar to the insulating layer 33, insulating resin may be used. For example, the thickness of the insulating layer 37 may be substantially 15 μm to 60 μm. The insulating layer 37 may include filler such as silica ($SiO_2$).

Moreover, the wiring layer 34, the insulating layer 35, the wiring layer 36, and the insulating layer 37 are representative examples of the wiring layers and the insulating layers which are alternately formed in a predetermined number on the first surface of the insulating layer 33 according to the present invention. However, the predetermined number may be arbitrarily determined. In addition, the insulating layer 37 is a representative example of the insulating layer which is formed finally on the first surface according to the present invention.

The wiring layer 40 includes a wiring pattern 41 and a via wiring 44 which is electrically connected to the wiring pattern 41. Moreover, the wiring layer 40 is a representative example of the outermost wiring layer according to the present invention. In addition, the wiring pattern 41 is a representative example of a reinforcing wiring pattern according to the present invention.

The wiring pattern 41 is formed on the insulating layer 37. The wiring pattern 41 includes a first layer 42, and a second layer 43 formed on the upper surface and the lower surface of the first layer 42. For example, as a material of the first layer 42, 42 alloy (ally in which nickel is added to steel) may be used. For example, 42 alloy may contain 42% of nickel, 57% of steel and 1% of other materials such as copper, manganese or the like. The thickness of the first layer 42 may be substantially 30 μm to 80 μm.

For example, as a material of the second layer 43, copper (Cu) or the like may be used. For example, the thickness of the second layer 43 may be substantially several micrometers. However, the second layer 43 may not necessarily be formed. That is, the wiring pattern 41 may be composed of only the first layer 42.

A via hole 37x, which penetrates the wiring pattern 41 and the insulating layer 37 and exposes the upper surface of the wiring layer 36, is formed in the wiring pattern 41 and the insulating layer 37. The via hole 37x becomes a truncated cone shaped concave portion such that the diameter of an opening portion at the solder-resist layer 48 side is larger than the diameter of an opening portion at the upper surface of the wiring layer 36. For example, the diameter of the opening portion of the via hole 37x may be substantially 30 μm.

The via wiring 44 is filled in the via hole 37x. The wiring pattern 41 is electrically connected to the wiring layer 36, which is exposed at the bottom portion of the via hole 37x, through the via wiring 44. The upper surface of the via wiring 44 is substantially flush with the upper surface of the second layer 43 formed on the upper surface of the first layer 42. For example, as a material of the via wiring 44, copper (Cu) or the like may be used.

A thermal expansion coefficient of a main component of the wiring pattern 41 becomes a value between a thermal expansion coefficient of a main component of other wiring layers (wiring layer 36 or the like) and a thermal expansion coefficient of a main component of the semiconductor chip 20. Here, the main component means the most components making up the member.

The wiring pattern 41 includes the first layer 42 and the second layer 43. However, since the component making up the first layer 42 is more than the component making up the second layer 43, the component making up the first layer 42 becomes the main component of the wiring pattern 41. That is, the thermal expansion coefficient of the component making up the first layer 42 becomes a value between the thermal expansion coefficient of the main component of other wiring layers (wiring layer 36 or the like) and the thermal expansion coefficient of the main component of the semiconductor chip 20.

For example, if the main component of other wiring layers (wiring layer 36 or the like) is copper (Cu), the thermal expansion coefficient is substantially 17.2 ppm/° C. If the main component of the semiconductor chip 20 is silicon, the thermal expansion coefficient is substantially 3.4 ppm/° C. In this case, the thermal expansion coefficient (the thermal expansion coefficient of the main component of the wiring pattern 41) of the material of the first layer 42 may be a value between 3.4 ppm/° C. and 17.2 ppm/° C.

For example, since the thermal expansion coefficient of 42 alloy is substantially 4.5 ppm/° C., as described above, the 42 alloy can be used as the material of the first layer 42. In addition, as a material of the first layer 42, Kovar (ally in which nickel and cobalt are added to steel), which has the thermal expansion coefficient of substantially 5.2 ppm/° C., or the like may be used.

The solder-resist layer 48 is formed on the insulating layer 37 to cover the wiring layer 40. Specifically, the solder-resist layer 48 has an opening portion 48x, and a portion of the wiring layer 40 is exposed at the bottom portion of the opening portion 48x. For example, the thickness of the solder-resist layer 48 may be substantially 50 μm to 100 μm. The solder-resist layer 48 may include filler such as silica ($SiO_2$).

A metal layer may be formed on the wiring layer 40 which is exposed at the bottom portion of the opening portion 48x. As an example of the metal layer, an Au layer, a Ni/Au layer (a metal layer in which a Ni layer and an Au layer are laminated in this order), a Ni/Pd/Au layer (a metal layer in which a Ni layer, a Pd layer, and an Au layer are laminated in this order), or the like may be used. Moreover, the solder-resist layer 48 is a representative example of a second outermost insulating layer according to the present invention.

The external connection terminal 49 is formed on the wiring layer 40 (on the metal layer if the metal layer is formed on the wiring layer 40) which is exposed at the bottom portion of the opening portion 48x. The external connection terminal 49 is to be electrically connected to a mounting substrate such as a motherboard or a pad provided on other semiconductor package or the like (not shown). For example, as the external connection terminal 49, a solder ball may be used. For example, as a material of the solder ball, an alloy including Pb, an alloy of Sn and Cu, an alloy of Sn and Sb, an alloy of Sn and Ag, an alloy of Sn, Ag, and Cu, or the like may be used.

In the present embodiment, the external connection terminal 49 is formed, but the external connection terminal 49 may not necessarily be formed. When the external connection terminal 49 is not formed, the wiring layer 40 (the metal layer if the metal layer is formed on the wiring layer 40) itself, which is exposed at the bottom portion of the opening portion 48x, becomes the external connection terminal. For example, a portion of the wiring layer 40 which is exposed from the solder-resist layer 48 may be configured as the external connection terminal 49. Hereinafter, the wiring layer 40 which is exposed at the bottom portion of the opening portion 48x may be referred to as a second electrode pad 40.

Moreover, in FIG. 1, the number of the second electrode pads 40 is reduced to simplify the drawing. However, actuality, for example, a plurality of second electrode pads 40 are provided in an area array form. For example, the planar shape of the second electrode pad 40 is circular, and for example, the diameter may be substantially 100 μm to 350 μm. For example, the pitch of the adjacent second electrode pads 40 may be substantially 400 μm to 500 μm.

The reason why the wiring pattern 41 is provided on the semiconductor package 10 will be now described. As described above, if the semiconductor chip is embedded on only one side in the thickness direction, there is a problem that a warpage occurs in the semiconductor package. That is, in the semiconductor package 10, the semiconductor chip 20 is embedded on the insulating layer 33 side while the semiconductor chip is not embedded on the insulating layer 37 side. As such, there is a concern that a warpage may occur in the semiconductor package 10 due to differences in physical property values (thermal expansion coefficient or Young's modulus) between the insulating layer 33 side in which the semiconductor chip 20 is embedded and the insulating layer 37 side in which the semiconductor chip 20 is not embedded.

In order to suppress the warpage, a member having physical property values close to those of the semiconductor chip 20 may be also disposed on the insulating layer 37 side. In the present embodiment, the wiring pattern 41 is disposed on the insulating layer 37. As described above, the thermal expansion coefficient of the main component of the wiring pattern 41 becomes a value between the thermal expansion coefficient of the main component of other wiring layers (wiring layer 36 or the like) and the thermal expansion coefficient of the main component of the semiconductor chip 20.

In the related art, the wiring pattern having the same component (the same material) as other wiring layers is disposed on the insulating layer 37. Meanwhile, in the present embodiment, the wiring pattern 41 is disposed which has the material, which is further close to the thermal expansion coefficient of the semiconductor chip 20 than the thermal expansion coefficient of the main component of other wiring layers, as the main component.

Specifically, the wiring pattern 41 contains 42 alloy or the like, which has the thermal expansion coefficient between the thermal expansion coefficient of copper which is the main component of other wiring layers and the thermal expansion coefficient of silicon which is the main component of the semiconductor chip 20, as the main component. Moreover, as described above, the thermal expansion coefficient of copper is substantially 17.2 ppm/° C., the thermal expansion coefficient of silicon is substantially 3.4 ppm/° C., and the thermal expansion coefficient of 42 alloy is substantially 4.5 ppm/° C., which becomes between the above values.

Since the wiring pattern 41 having the 42 alloy as the main component is disposed on the insulating layer 37, the thermal expansion coefficient of the insulating layer 37 side can be close to the thermal expansion coefficient of the insulating layer 33 side in which the semiconductor chip 20 is embedded. As a result, since balance of physical property values in the upper and lower sides of the semiconductor package 10 is achieved, the warpage of the semiconductor package 10 due to thermal stress or the like can be prevented.

In addition, Young' modulus of silicon which is the main component of the semiconductor chip 20 is substantially 200 GPa, and Young's modulus of copper which is the main component of other wiring layers (wiring layer 36 or the like) is substantially 118 GPa. On the other hand, Young's modulus of the 42 alloy is substantially 145 GPa. Accordingly, Young's modulus of the main component of the wiring pattern 41 is a value between Young's modulus of the main component of other wiring layers (wiring layer 36 or the like) and Young's modulus of the main component of the semiconductor chip 20, and thus the stiffness of the entire semiconductor package 10 can be improved.

In addition, as the thickness of the wiring pattern 41 is thicker, it can contribute to a decrease of the warpage or the improvement of the stiffness of the semiconductor package 10. Moreover, as the area of the wiring pattern 41 which occupies the insulating layer 37 is wider, it can contribute to the decrease of the warpage or improvement of the stiffness of the semiconductor package 10. In addition, as the thermal expansion coefficient or Young's modulus of the main component of the wiring pattern 41 approaches the thermal expansion coefficient or Young's modulus of the main component of the semiconductor chip 20, it can contribute to the decrease of the warpage or the improvement of the stiffness of the semiconductor package 10.

However, the thicker the thickness of the wiring pattern 41 is, the thicker the thickness of the semiconductor package 10 is, and the wider the area of the wiring pattern 41 is, the wider the width of the semiconductor package 10 is. Therefore, it is preferable to appropriately determine the thickness or the area of the wiring pattern 41 by comparing and considering the decrease of the warpage and improvement of the stiffness of the semiconductor package 10 and specifications such as dimensions required for the semiconductor package 10.

Figure 2:
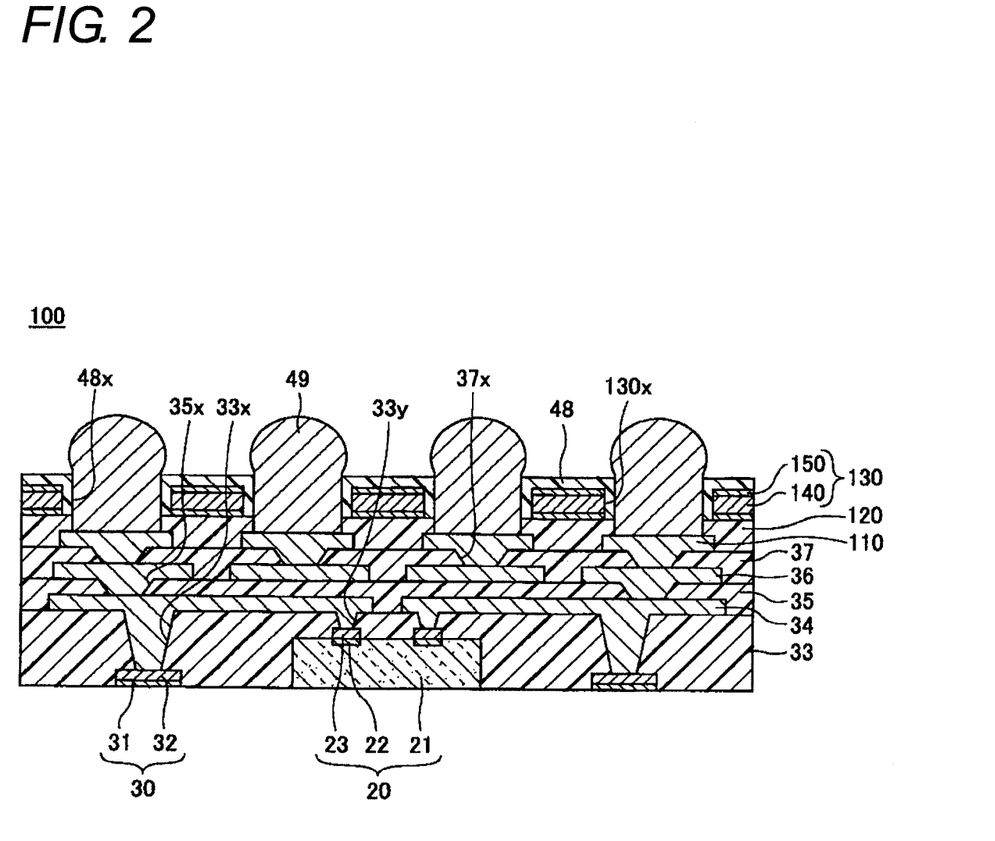
FIG. 2 is a cross-sectional view showing a semiconductor package according to Comparative Example.

Incidentally, it may be considered to prepare a stiffener to suppress the warpage of the semiconductor package 10 and to improve the stiffness of the semiconductor package 10. FIG. 2 is a cross-sectional view showing a semiconductor package according to Comparative Example. Referring to FIG. 2, a semiconductor package 100 according to Comparative Example is different from the semiconductor package 10 (see FIG. 1) in that the wiring layer 40 is replaced by a wiring layer 110, an insulating layer 120 which covers the wiring layer 110 is added, and a stiffener 130 is disposed on the insulating layer 120.

The wiring layer 110 is formed of the same material as the other wiring layers (wiring layer 36 or the like). The insulating layer 120 is formed on the insulating layer 37 to cover the wiring layer 110. As a material of the insulating layer 120, insulating resin similar to the insulating layer 33 may be used. For example, the thickness of the insulating layer 120 may be substantially 15 μm to 60 μm. The insulating layer 120 may include filler such as silica ($SiO_2$).

The stiffener 130 is a stiffened member in which a metal layer 150 is formed on the surface of a plate member 140. An opening portion 130x is formed in the stiffener 130. The stiffener 130 is covered by the solder-resist layer 48. For example, as a material of the plate member 140, 42 alloy or the like may be used. For example, the thickness of the plate member 140 may be substantially 30 μm to 80 μm. For example, as a material of the metal layer 150, copper (Cu) or the like may be used. For example, the thickness of the metal layer 150 may be several micrometers.

By providing the stiffener 130, a distance between the surface of the wiring layer 110 and the surface of the solder-resist layer 48 is longer than a distance between the surface of the wiring layer 40 and the surface of the solder-resist layer 48 in the semiconductor package 10. That is, a depth of the opening portion 48x is deeper compared to the case of the semiconductor package 10.

As such, in order to make the projected amount of the external connection terminal 49 from the surface of the solder-resist layer 48 be the same as the semiconductor package 10, the diameter of the opening portion 48x is larger than the case of the semiconductor package 10, and thus, it is necessary to mount a solder ball having large diameter as the external connection terminal 49. Thereby, it is difficult to achieve a narrow pitch of the external connection terminal 49. Moreover, there is a concern that the stiffener 130 and the external connection terminal 49 may be short-circuited.

On the other hand, in the semiconductor package 10 according to the present embodiment, the above-described problems can be solved, and it is possible to suppress the warpage of the semiconductor package 10 or improve the stiffness of the semiconductor package 10.

Next, a manufacturing method of a semiconductor package according to a first embodiment will be now described. FIGS. 3A to 5C are views showing the manufacturing process of a semiconductor package according to the first embodiment.

Figure 3A:
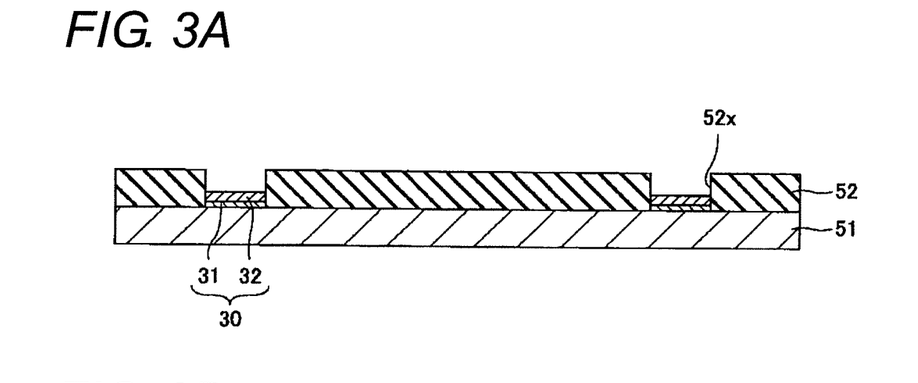
FIGS. 3A to 3C are first views showing a manufacturing process of a semiconductor package according to the first embodiment.
Figure 5A:
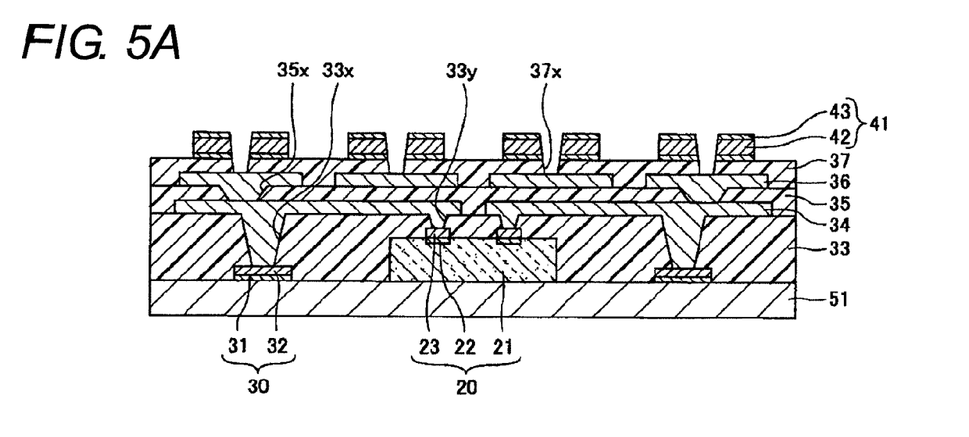
FIGS. 5A to 5C are third views showing the manufacturing process of the semiconductor package according to the first embodiment.

First, in the process shown in FIG. 3A, a support 51 is prepared. As the support 51, a silicon plate, a glass plate, a metal plate, a metal foil, or the like may be used. However, in the present embodiment, a copper foil is used as the support 51. This is because the copper foil can be used as a power supply layer in electroplating and can be easily removed by etching as shown in FIG. 5C described below. For example, the thickness of the support 51 may be substantially 35 μm to 100 μm.

Subsequently, a resist layer 52 having an opening portion 52x corresponding to the wiring layer 30 is formed on one surface of the support 51. Specifically, for example, a liquid or a pasty resist, which is formed of photosensitive resin compositions including epoxy resin, acrylic resin, or the like, is formed on one surface of the support 51. Alternatively, for example, a film-like resist (for example, a dry film resist or the like), which is formed of photosensitive resin compositions including epoxy resin, acrylic resin, or the like, is laminated on one surface of the support 51.

Moreover, by exposing and developing the resist, the opening portion 52x is formed through the resist. Thereby, the resist layer 52 including the opening portion 52x is formed. Moreover, the film-like resist, in which the opening portion 52x is formed in advance, may be laminated on one surface of the support 51. The opening portion 52x is formed on the position corresponding to the wiring layer 30 shown in FIG. 1. For example, the planar shape of the opening portion 52x is circular, and for example, the diameter may be substantially 100 μm to 350 μm.

Subsequently, the wiring layer 30 including the first layer 31 and the second layer 32 is formed in the opening portion 52x of one surface of the support 51 by an electroplating method using the support 51 as the plated power supply layer. For example, the first layer 31 has a structure in which a gold (Au) film, a palladium (Pd) film, and a nickel (Ni) film are sequentially laminated in the order.

Accordingly, in order to form the wiring layer 30, first, the first layer 31 is formed by plating a gold (Au) film, a palladium (Pd) film, and a nickel (Ni) film sequentially by the electroplating method or the like which uses the support 51 as the plated power supply layer. In addition, the second layer 32 configured of copper (Cu) or the like is formed on the first layer 31 by the electroplating method which uses the support 51 as the plated power supply layer. Moreover, the first layer 31 may have a structure in which a gold (Au) film and a nickel (Ni) film is sequentially laminated in the order.

Figure 3B:
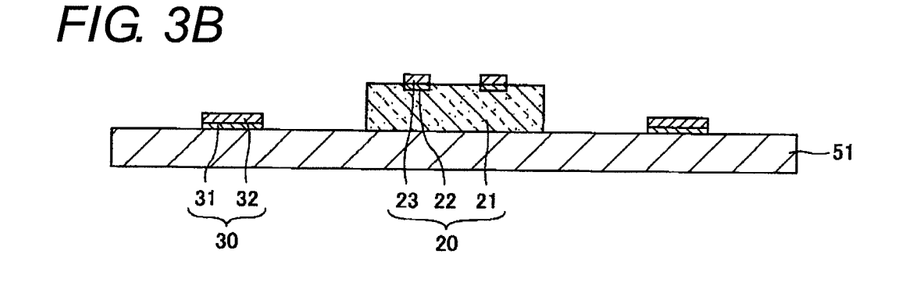

Subsequently, in a process shown in FIG. 3B, the semiconductor chip 20 is prepared. The semiconductor chip 20 includes the semiconductor substrate 21, the electrode pad 22, and the projection electrode 23, and the electrode pad 22 and the projection electrode 23 are formed on the circuit forming surface side of the semiconductor chip 20. For example, the semiconductor chip 20 is thinned to be substantially 75 μm. Moreover, after the resist layer 52 shown in FIG. 3A is removed, the semiconductor chip 20 is disposed on one surface of the support 51 via an adhesion layer (not shown) such as a die attach film in a state of face up (a state where the circuit forming surface is toward the upper side).

Subsequently, in a process shown in FIG. 3C, the insulating layer 33 is formed on one surface of the support 51 so as to cover the circuit forming surfaces and the side surface of the semiconductor chip 20 and the upper surface and the side surface of the wiring layer 30. For example, as a material of the insulating layer 33, thermosetting insulating resin, which contains epoxy resin, phenolic resin, or the like as the main component, may be used. For example, the thickness of the insulating layer 33 may be substantially 120 μm. The insulating layer 33 may include filler such as silica ($SiO_2$).

For example, as a material of the insulating layer 33, when using the insulating resin which contains film-like epoxy resin or phenolic resin having thermosetting property, or the like as the main component, the following processes can be performed. That is, the film-like insulating layer 33 is laminated on one surface of the support 51 so as to cover the circuit forming surface and the side surface of the semiconductor chip 20 and the upper surface and the side surface of the wiring layer 30. In addition, the insulating layer 33 is cured by heating the layer to the hardening temperature or more while pressing the laminated insulating layer 33. Moreover, a void can be prevented by laminating the insulating layer 33 in vacuum atmosphere.

For example, as a material of the insulating layer 33, when using the insulating resin which has liquid or pasty epoxy resin or phenolic resin having thermosetting property, or the like as the main component, the following processes can be performed. That is, for example, the liquid or pasty insulating layer 33 is formed on one surface of the support 51 by a roll coat method or the like so as to cover the circuit forming surfaces and the side surface of the semiconductor chip 20 and the upper surface and the side surface of the wiring layer 30. In addition, the insulating layer 33 is cured by heating the coated insulating layer 33 to the hardening temperature or more.

Moreover, the via hole 33x which penetrates the insulating layer 33 and exposes the upper surface of the wiring layer 30, and the via hole 33y which penetrates the insulating layer 33 and exposes the upper surface of the projection electrode 23 are formed on the hardened insulating layer 33. For example, the via hole 33x and the via hole 33y may be formed by a laser processing method using $CO_2$ laser or the like.

The via hole 33x, which is formed by the laser processing method, becomes a truncated cone shaped concave portion such that the diameter of an opening portion on the first surface side of the insulating layer 33 is larger than the diameter of the opening portion on the upper surface of the wiring layer 30. For example, the diameter of the opening portion of the via hole 33x may be substantially 150 μm.

The via hole 33y, which is formed by the laser processing method, becomes a truncated cone shaped concave portion such that the diameter of an opening portion on the first surface side of the insulating layer 33 is larger than the diameter of the opening portion on the upper surface of the projection electrode 23. For example, the diameter of the opening portion of the via hole 33y may be substantially 30 μm.

Figure 3C:
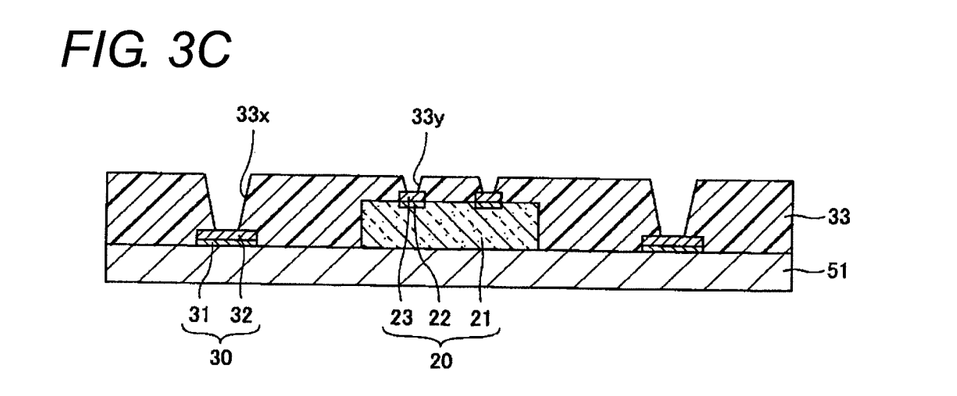

Moreover, when the via hole 33x and the via hole 33y are formed by the laser processing method, it is preferable that desmear treatment be performed after the process shown in FIG. 3C. By performing the desmear treatment, resin residues of the insulating layer 33 can be removed which are attached to the upper surface of the wiring layer 30 exposed at the bottom portion of the via hole 33x and the upper surface of the projection electrode 23 exposed at the bottom portion of the via hole 33y.

Figure 4A:
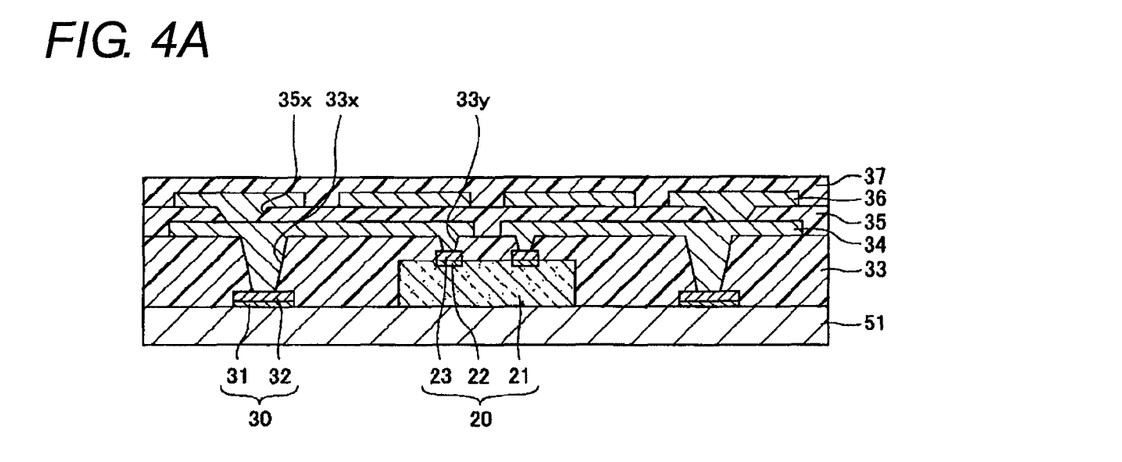
FIGS. 4A to 4C are second views showing the manufacturing process of the semiconductor package according to the first embodiment.

Subsequently, in a process shown in FIG. 4A, the wiring layer 34, the insulating layer 35, the wiring layer 36, and the insulating layer 37 are sequentially formed on the insulating layer 33. First, the wiring layer 34, which includes the via wiring filled in the via hole 33x, the via wiring filled in the via hole 33y, and the wiring pattern formed on the insulating layer 33, is formed using various wiring forming methods such as a semi-additive method or a subtractive method. For example, as a material of the wiring layer 34, copper (Cu) or the like may be used. For example, the thickness of the wiring pattern which configures the wiring layer 34 may be substantially 10 μm to 20 μm.

In addition, for example, when the thickness of the insulating layer 33 is 120 μm and the thickness of the wiring layer 30 is 10 μm, the depth of the via hole 33x becomes 110 μm, and thus, it is difficult to fill the via wiring into the via hole 33x. Thereby, the via wiring is not filled in the via hole 33x and may be formed in a film shape on only the side wall of the via hole 33x and the upper surface of the wiring layer 30.

Subsequently, the insulating layer 35 is formed on the insulating layer 33 to cover the wiring layer 34 and then the insulating layer 35 is cured. The via hole 35x, which penetrates the hardened insulating layer 35 and exposes the upper surface of the wiring layer 34, is formed. As a material of the insulating layer 35, the insulating resin similar to the insulating layer 33 may be used. For example, the thickness of the insulating layer 35 may be substantially 15 μm to 60 μm. The insulating layer 35 may include filler such as silica ($SiO_2$).

Moreover, the wiring layer 36, which is connected to the wiring layer 34 through the via hole 35x, is formed on the insulating layer 35. The wiring layer 36 includes the via wiring filled in the via hole 35x and the wiring pattern formed on the insulating layer 35. The wiring layer 36 is electrically connected to the wiring layer 34 which is exposed at the bottom portion of the via hole 35x. For example, as a material of the wiring layer 36, copper (Cu) or the like may be used. For example, the wiring layer 36 may be formed by a semi-additive method. For example, the thickness of the wiring pattern of the wiring layer 36 may be substantially 10 μm to 20 μm.

Subsequently, the insulating layer 37 is formed on the insulating layer 35 to cover the wiring layer 36. As a material of the insulating layer 37, the insulating resin similar to the insulating layer 33 may be used. For example, the thickness of the insulting layer 37 may be substantially 15 μm to 60 μm. The insulating layer 37 may include filler such as silica ($SiO_2$). However, the insulating layer 37 is not hardened at this point and is maintained to a B stage state (a half hardened state).

Subsequently, in the processes shown in FIGS. 4B to 5B, the wiring layer 40 is formed. First, in the process shown in FIG. 4B, a conductive member 410, in which a metal layer 430 is formed on the surface of a plate member 420, is prepared. For example, as a material of the plate member 420, 42 alloy or the like can be used. For example, the thickness of the plate member 420 may be substantially 30 μm to 80 μm.

Figure 4B:
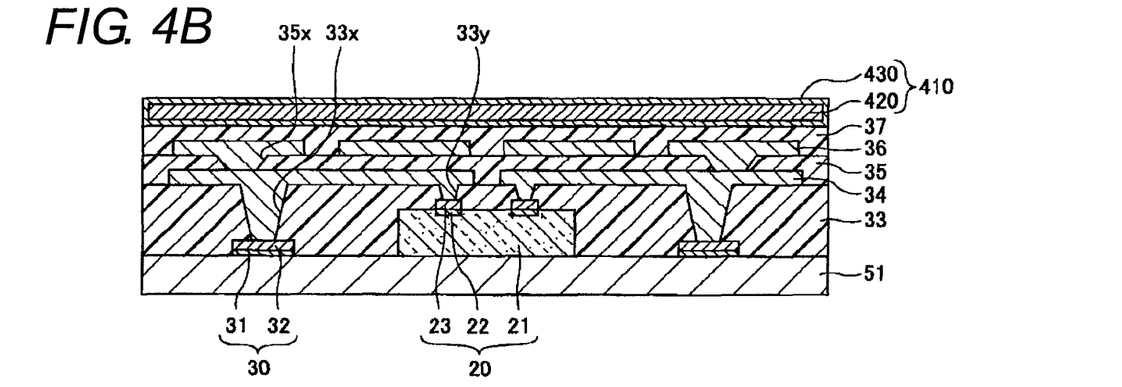

For example, as a material of the metal layer 430, copper (Cu) or the like may be used. For example, the thickness of the metal layer 430 may be substantially several micrometers. Moreover, the plate member 420 becomes the first layer 42 of the wiring pattern 41, and the metal layer 430 becomes the second layer 43 of the wiring pattern 41.

Subsequently, the prepared member 410 is disposed on the insulating layer 37 of a B stage state (a half hardened state). Moreover, the insulating layer 37 is cured by heating the layer to the hardening temperature or more while pressing the member 410 against the insulating layer 37. Thereby, the member 410 is fixed to the insulating layer 37. Moreover, the metal layer 430 may not be formed on the surface of the plate member 420 and only the plate member 420 may be used as the member 410. However, if the metal layer 430 such as copper (Cu) is formed on the surface of the plate member 420, it is advantageous in view of the improvement of adhesiveness between the metal layer 430 and the insulating layer 37.

Subsequently, in the process shown in FIG. 4C, the reinforcing wiring pattern 41 is formed by patterning the member 410. Specifically, a resist layer (not shown) is formed on the member 410, and the resist layer (not shown) other than a portion of resist layer corresponding to the wiring pattern 41 is removed by a photolithography method.

Moreover, a portion of the member 410 which is not covered by the resist layer (not shown) is removed by etching using the resist layer (not shown) as a mask. Thereafter, by removing the resist layer (not shown), the wiring pattern 41 is formed to include the first layer 42 and the second layer 43 which is formed on the upper surface and the lower surface of the first layer 42. For example, the wiring pattern 41 may be formed in an area array form. However, the wiring pattern 41 may be formed in a predetermined planar shape.

Moreover, etching liquid, which can simultaneously remove the plate member 420 and the metal layer 430, may be used to remove the member 410. However, according to combination of the materials of the plate member 420 and the metal layer 430, the etching liquid, which can simultaneously remove the plate member 420 and the metal layer 430, may not exist. In this case, first, the metal layer 430 which is formed on the upper surface of the plate member 420 is removed by etching liquid capable of removing the metal layer 430. Moreover, the plate member 420 is removed using etching liquid capable of removing the plate member 420, and the metal layer 430, which is formed on the lower surface of the plate member 420, may be removed using etching liquid capable of the metal layer 430.

Subsequently, in the process shown in FIG. 5A, the via hole 37x (through hole) is formed to penetrate the wiring pattern 41 and the insulating layer 37 and expose the upper surface of the wiring layer 36. For example, the via hole 37x may be formed by a laser processing method which uses $CO_2$ laser or the like. The via hole 37x is formed by the laser processing method, becomes a truncated cone shaped concave portion such that the diameter of the opening portion at the solder-resist layer 48 is formed is larger than the diameter of the bottom surface of the opening portion formed by the upper surface of the wiring layer 36. For example, the diameter of the opening portion of the via hole 37x may be substantially 30 μm.

Subsequently, in the process shown in FIG. 5B, the via wiring 44 which fills the via hole 7x is formed. For example, in order to form the via wiring 44, a metal layer formed of copper (Cu) is formed to cover the inner wall surface of the via hole 37x and the upper surface of the wiring layer 36 exposed into the via hole 37x by an electroless plating method or the like.

Moreover, the inner portion of the via hole 37x is filled with copper (Cu) or the like by the electroplating method using the metal layer as a power supply layer. Thereby, the via hole 37x is filled with the via wiring 44, and the wiring layer 40, which includes the wiring pattern 41 and the via wiring 44 electrically connected to the wiring pattern 41, is formed. The wiring pattern 41 is electrically connected to the wiring layer 36 through the via wiring 44.

Subsequently, in the process shown in FIG. 5C, the solder-resist layer 48, which includes the opening portion 48x which exposes a portion of the wiring layer 40, is formed on the insulating layer 37. For example, the solder-resist layer 48 may be formed by coating liquid or pasty photosensitive epoxy or acrylic insulating resin on the insulating layer 37 by a screen printing method, a roll coat method, a spin coat method, or the like, so as to cover the wiring layer 40. Alternatively, for example, the solder-resist layer 48 may be formed by laminating film-like photosensitive epoxy or acrylic insulating resin on the insulating layer 37 so as to cover the wiring layer 40.

The opening portion 48x may be formed by exposing and developing the coated or laminated insulating resin (photolithography method). The film-like insulating resin, in which the opening portion 48x is formed in advance, may be laminated on the insulating layer 37 so as to cover the wiring layer 40. Moreover, as a material of the solder-resist layer 48, non-photosensitive insulating resin may be used. In this case, after the solder-resist layer 48 is formed on the insulating layer 37 and then is cured, for example, the opening portion 48x may be formed by a laser processing method using $CO_2$ laser or the like, or blast processing using abrasives such as alumina abrasives.

According to the process shown in FIG. 5C, the solder-resist layer 48 including the opening portion 48x is formed, and a portion of the wiring layer 40 is exposed from the opening portion 48x. For example, a metal layer may be formed by an electroless plating method on the wiring layer 40 exposed at the bottom portion of the opening portion 48x. As an example of the metal layer, an Au layer, a Ni/Au layer (a metal layer in which a Ni layer and an Au layer are laminated in the order), a Ni/Pd/Au layer (a metal layer in which a Ni layer, a Pd layer, and an Au layer are laminated in the order), or the like may be used.

Subsequently, the support 51 is removed. For example, the support 51 formed of a copper foil may be removed by wet etching using ferric chloride water solution, cupric chloride water solution, persulphuric acid ammonium water solution, ammonium chloride copper water solution, hydrogen peroxide water-sulfuric acid based etching liquid, or the like.

Since the outermost layer of the wiring layer 30, which is exposed from the insulating layer 33, is a gold (Au) film or the like, only the support 51 formed of a copper foil may be selectively etched. However, when the surface of the wiring layer 40 is formed of copper (Cu), in order to prevent the wiring layer 40 exposed at the bottom portion of the opening portion 48x from being etched along with the support 51, it is necessary to mask the wiring layer 40 exposed at the bottom portion of the opening portion 48x. Moreover, after the support 51 is removed, the adhesion layer such as the die attach film attached to the rear surface of the semiconductor chip 20 may be also removed by plasma treatment or the like.

Subsequently, after the process shown in FIG. 5C, by forming the external connection terminal 49 on the wiring layer 40 (on the metal layer if the metal layer is formed on the wiring layer 40) which is exposed at the bottom portion of the opening portion 48x, the semiconductor package 10 shown in FIG. 1 is completed. The external connection terminal 49 serves as a terminal which is electrically connected to a mounting substrate such as a motherboard or a pad provided on other semiconductor package or the like (not shown).

For example, as the external connection terminal 49, a solder ball or the like may be used. For example, as a material of the solder ball, an alloy including Pb, an alloy of Sn and Cu, an alloy of Sn and Sb, an alloy of Sn and Ag, an alloy of Sn, Ag, and Cu, or the like may be used.

For example, in the external connection terminal 49, as a surface treatment agent, flux is coated on the wiring layer 40 (on the metal layer if the metal layer is formed on the wiring layer 40) which is exposed at the bottom portion of the opening portion 48x. Moreover, a solder ball is mounted, reflow is performed at a temperature of substantially 240° C. to 260° C., and then the external connection terminal 49 may be formed by cleaning the surface and removing the flux.

Alternatively, the resist layer, which exposes the region forming the external connection terminal 49, is formed on the solder-resist layer 48, and soldering paste is printed on the region which is exposed from the resist layer. Moreover, reflow is performed at a temperature of substantially 240° C. to 260° C., and then the external connection terminal 49 may be formed by cleaning the surface and removing the flux. Moreover, as the external connection terminal 49, a lead pin or the like may be used.

In the present embodiment, the external connection terminal 49 is formed while the external connection terminal 49 may not necessarily be formed. When the external connection terminal 49 is not formed, the wiring layer 40 (the metal layer if the metal layer is formed on the wiring layer 40) itself which is exposed at the bottom portion of the opening portion 48x serves as the external connection terminal. A portion of the wiring layer 40 exposed from the solder-resist layer 48 can be used as the external connection terminal 49.

In addition, FIGS. 3A to 5C show a state where one semiconductor package 10 is manufactured on the support 51. Meanwhile, the process of the present embodiment can be applied to a process for manufacturing a plurality of semiconductor packages 10 on the support 51. In this case, after the support 51 is removed and the external connection terminal 49 is formed, the semiconductor package is divided into plural pieces by dicing thereby obtaining the plurality of semiconductor packages 10. In this process, the semiconductor package may be divided to include the plurality of semiconductor chips 20. In this case, the semiconductor package including the plurality of semiconductor chips 20 is manufactured.

In the first embodiment, in the semiconductor package 10, the wiring pattern 41 formed of the material having physical property values which is close to the semiconductor chip 20 is disposed on an opposite side (solder-resist layer 48 side) in the thickness direction of the insulating layer 33 in which the semiconductor chip 20 is not embedded.

The thermal expansion coefficient of the main component of the wiring pattern 41 becomes the value between the thermal expansion coefficient of the main component of other wiring layers (wiring layer 36 or the like) and the thermal expansion coefficient of the main component of the semiconductor chip 20. Thereby, the thermal expansion coefficient of the solder resist layer 48 side can be close to the thermal expansion coefficient of the insulating layer 33 side in which the semiconductor chip 20 is embedded. Since balance of physical property values in the upper and lower sides of the semiconductor package 10 is achieved, the warpage of the semiconductor package 10 caused by thermal stress or the like can be prevented.

In addition, Young's modulus of the main component of the wiring pattern 41 becomes the value between Young's modulus of the main component of other wiring layers (wiring layer 36 or the like) and Young's modulus of the main component of the semiconductor chip 20, and thus, the stiffness of the entire semiconductor package 10 can be improved.

<Modification 1 of First Embodiment>

Figure 6:
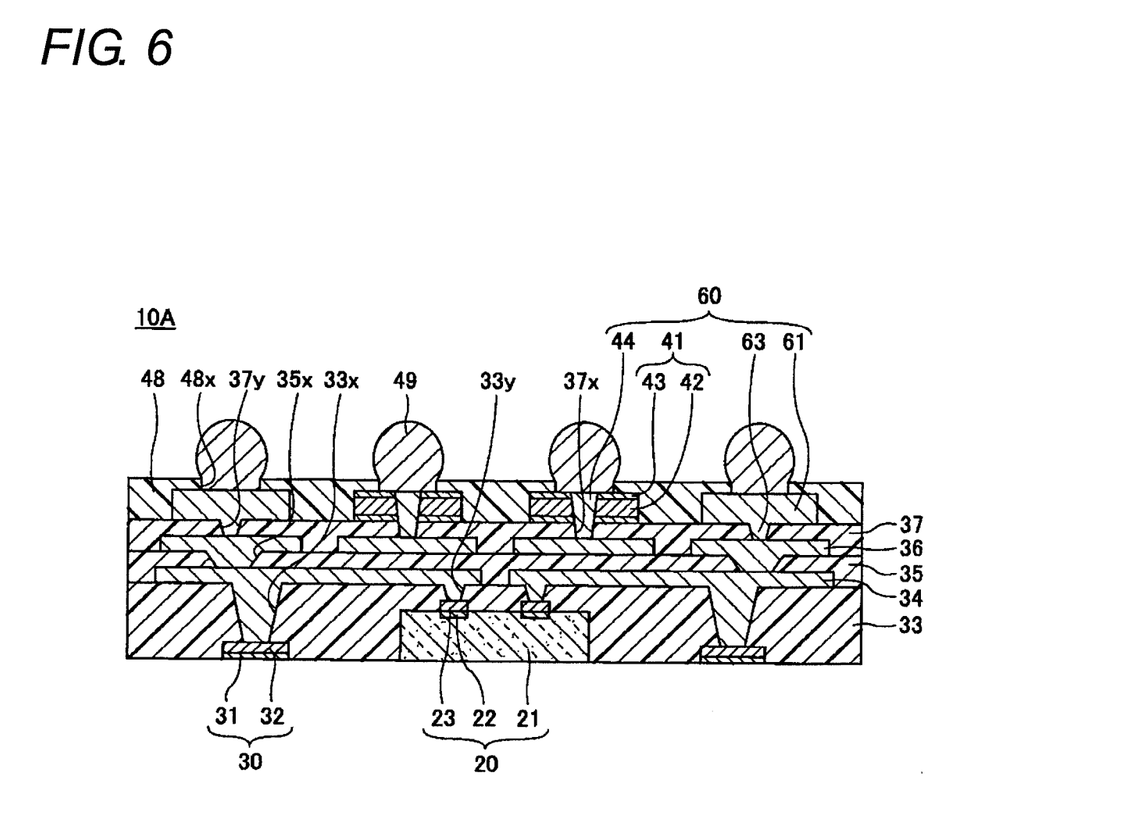
FIG. 6 is a cross-sectional view showing the semiconductor package according to Modification 1 of the first embodiment.

In Modification 1 of the first embodiment, the reinforcing wiring pattern is provided only on a portion of the outermost wiring layer of the solder-resist layer 48 side. Moreover, in Modification 1 of the first embodiment, descriptions with respect to the same components as the above-described embodiment are omitted.

FIG. 6 is a cross-sectional view showing a semiconductor package according to Modification 1 of the first embodiment. Referring FIG. 6, a semiconductor package 10A is different from the semiconductor package 10 (refer to FIG. 1) in that the wiring layer 40 is replaced by the wiring layer 60.

The wiring layer 60 includes the wiring pattern 41 which includes the first layer 42, the second layer 43 formed on the upper surface and the lower surface of the first layer 42, the via wiring 44, a wiring pattern 61, and a via wiring 63. The wiring pattern 41 is disposed in the vicinity (the upper portion of the region in which the semiconductor chip 20 is embedded) of the center portion of the insulating layer 37 in a plan view, and the wiring pattern 61 is disposed around the wiring pattern 41 (disposed at the peripheral portion of the insulating layer 37) in a plan view.

The via wiring 63 is integrally formed with the wiring pattern 61 in the via hole 37y which penetrates the insulating layer 37 and exposes the upper surface of the wiring layer 36. The wiring pattern 61 is electrically connected to the wiring layer 36 through the via wiring 63. The materials of the wiring pattern 61 and the via wiring 63 are similar to the material of the wiring layer 36 or the like. That is, if the material of the wiring layer 36 or the like is copper (Cu), the materials of the wiring pattern 61 and the via wiring 63 also are copper (Cu). In addition, the thickness of the wiring pattern 61 may not be the same as the thickness of the wiring pattern 41.

Figure 4C:
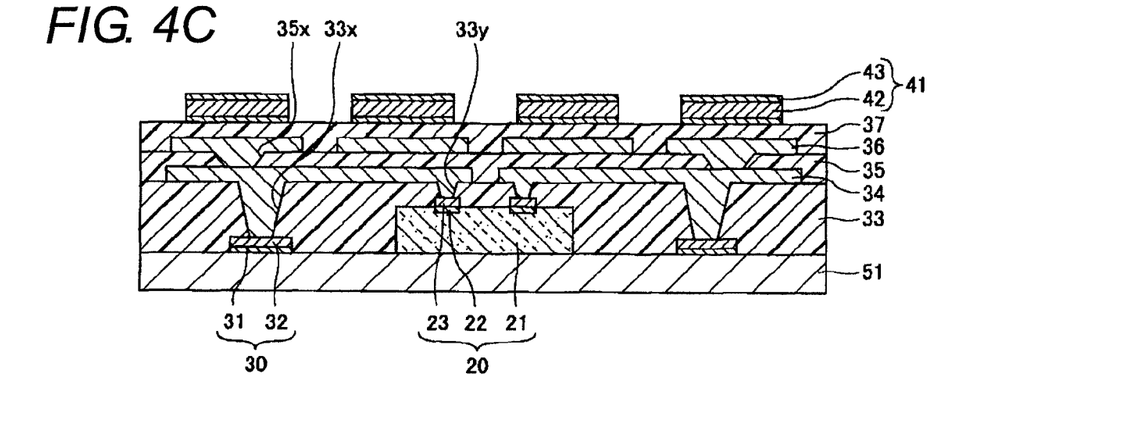

In order to form the wiring layer 60, the wiring pattern 41 shown in FIG. 6 is manufactured through the processes shown in FIGS. 4B and 4C. In addition, through the process shown in FIG. 5A, the via hole 37x, which penetrates the wiring pattern 41 and the insulating layer 37 and exposes the upper surface of the wiring layer 36, is formed. Moreover, the via hole 37y, which penetrates the insulating layer 37 and exposes the upper surface of the wiring layer 36, is formed.

Figure 5B:
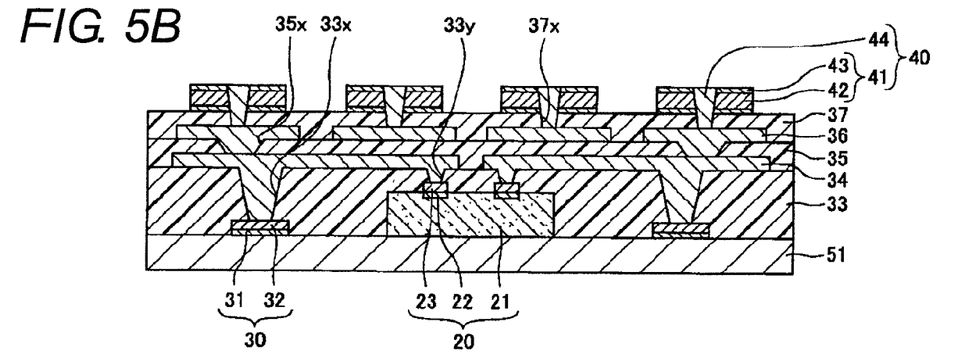
Figure 5C:
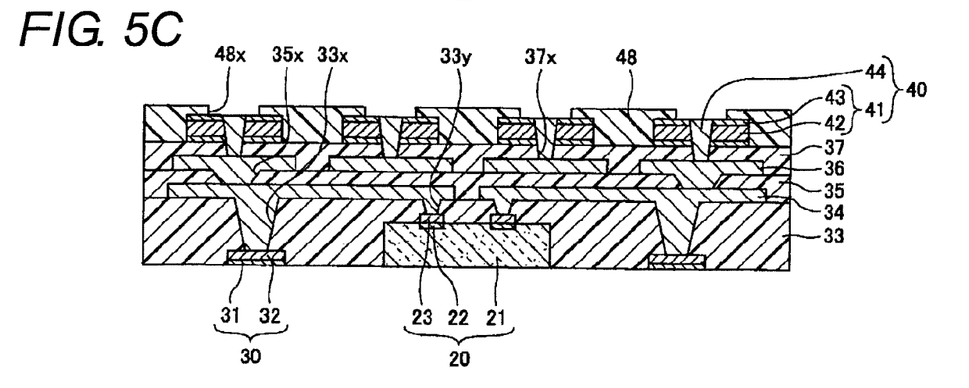

Moreover, through the process shown in FIG. 5B, the via wiring 44 which fills the via hole 37x is formed. In addition, the via wiring 63 which fills the via hole 37y and the wiring pattern 61 formed on the insulating layer 37 are integrally formed with each other. Thus, the wiring layer 60 may be formed. Moreover, the wiring layer 60 is a representative example of the outermost wiring layer according to the present invention.

In this way, if the wiring pattern 41 is disposed only in the vicinity (the upper portion of the region in which the semiconductor chip 20 is embedded) of the center portion of the insulating layer 37 in a plan view, the semiconductor chip 20 and the wiring pattern 41 are disposed to be substantially symmetrical up and down. Thereby, since balance of physical property values in the upper and lower sides of the semiconductor package 10A is achieved, the warpage of the semiconductor package 10A due to thermal stress can be prevented, and the stiffness of the entire semiconductor package 10A can be improved.

<Modification 2 of First Embodiment>

Modification 2 of the first embodiment shows an example in which the thermal expansion coefficient of the main component of the first electrode pad which is exposed at the semiconductor chip 20 side becomes a value between the thermal expansion coefficient of the main component of the wiring layer 36 or the like and the thermal expansion coefficient of the main component of the semiconductor chip 20. In Modification 2 of the first embodiment, descriptions with respect to the same components as the above-described embodiment are omitted.

Figure 7:
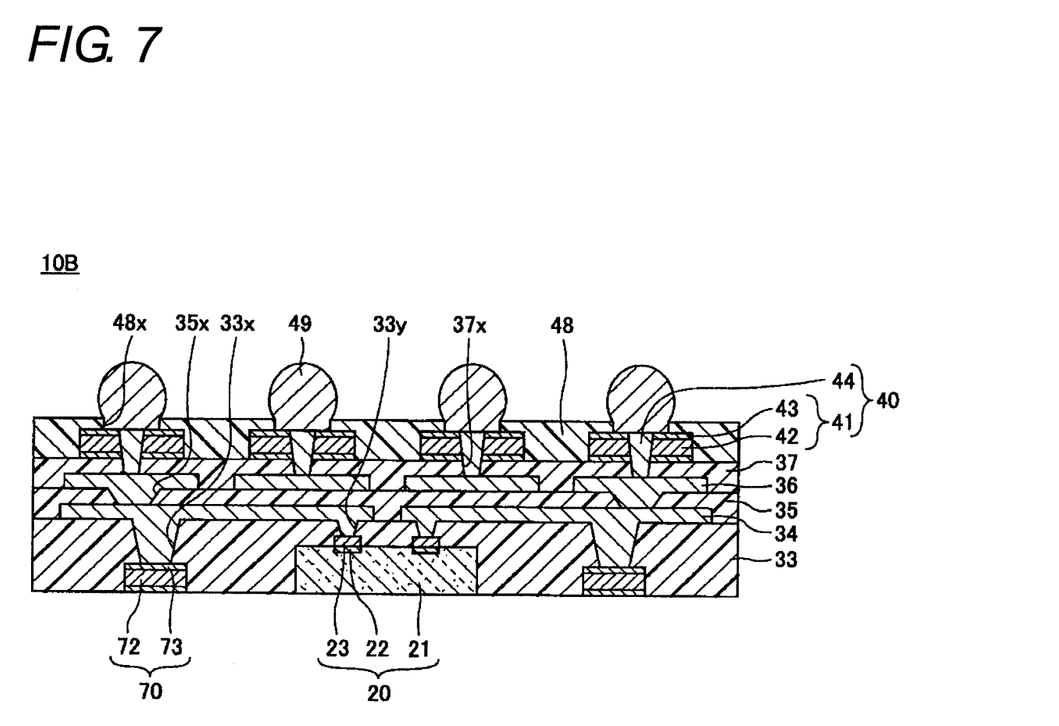
FIG. 7 is a cross-sectional view showing a semiconductor package according to Modification 2 of the first embodiment.

FIG. 7 is a cross-sectional view showing a semiconductor package according to Modification 2 of the first embodiment. Referring to FIG. 7, a semiconductor package 10B is different from the semiconductor package 10 (see FIG. 1) in that the wiring layer 30 is replaced by a wiring layer 70.

The wiring layer 70 includes a first layer 72, and a second layer 73 which is formed on the upper surface and the lower surface of the first layer 72. The thermal expansion coefficient of the main component of the wiring layer 70 becomes a value between the thermal expansion coefficient of the main component of other wiring layers (wiring layer 36 or the like) and the thermal expansion coefficient of the main component of the semiconductor chip 20. The materials of the first layer 72 and the second layer 73 of the wiring layer 70 may be similar to the materials of the first layer 42 and the second layer 43 of the wiring layer 40 respectively. For example, the thickness of the wiring layer 70 may be similar to the thickness of the wiring layer 40.

A portion (the lower surface of the second layer 73 formed on the lower surface of the first layer 72) of the wiring layer 70 is exposed from the insulating layer 33, and is substantially flush with the lower surface of the insulating layer 33 and the rear surface of the semiconductor chip 20. A portion (the lower surface of the second layer 73 formed on the lower surface of the first layer 72) of the wiring layer 70 serves as an electrode pad which is electrically connected to other semiconductor packages or semiconductor chips, electronic components (not shown), or the like. Hereinafter, the wiring layer 70 which is exposed from the insulating layer 33 may be referred to as a first electrode pad 70.

In addition, in FIG. 7, the number of the first electrode pads 70 is reduced to simplify the drawing. However, actually, for example, a plurality of rows of first electrode pads 70 are provided to surround the rear surface of the semiconductor chip 20 in a frame shape in a plan view. For example, the planar shape of the first electrode pad 70 is circular, and for example, the diameter may be substantially 100 μm to 350 μm. For example, the pitch of the first electrode pads 70 may be substantially 400 μm to 500 μm.

For example, in order to form the wiring layer 70, a member similar to the member 410 shown in FIG. 4B is fixed to one surface of the support 51 through the adhesion layer and may be patterned through the process shown in FIG. 4C. Moreover, since the lower surface of the second layer 73 formed on the lower surface of the first layer 72 is covered by the adhesion layer, even though the second layer 73 has the same material as that of the support 51, in the process shown in FIG. 5C, the second layer 73, which is formed on the lower surface of the first layer 72, is not removed along with the support 51. However, after the support 51 is removed, it is necessary to remove the adhesion layer, which is formed on the lower surface of the second layer 73, by plasma treatment or the like.

In this way, the thermal expansion coefficient of the main component of the first electrode pad 70 which is exposed at the semiconductor chip 20 side becomes a value between the thermal expansion coefficient of the main component of the wiring layer 36 or the like and the thermal expansion coefficient of the main component of the semiconductor chip 20. Thereby, the semiconductor chip 20 and the wiring pattern 41 above the semiconductor chip 20 are disposed to be substantially symmetrical up and down, and the first electrode pad 70 and the wiring pattern 41 above the first electrode pad 70 are disposed so as to be substantially symmetrical up and down. As a result, since balance of physical property values in the upper and lower sides of the semiconductor package 10B is achieved, the warpage of the semiconductor package 10B due to thermal stress or the like can be prevented. Moreover, the stiffness of the entire semiconductor package 10B can be improved. Particularly, the warpage in the outer circumferential side of the semiconductor package 10B can be decreased.

<Simulation of Warpage>

With respect to a semiconductor package in which an insulating layer and a wiring layer are alternately formed one by one between the wiring layer 34 and the insulating layer 35 in FIG. 1 and total four wiring layers and five insulating layers (including one solder-resist layer) are provided, simulation of warpage was performed. Here, the material of the wiring pattern 41 was a 42 alloy. For convenience, the package is referred to as a semiconductor package 10C.

Moreover, for comparison, simulation of the warpage in a case where the material of the wiring pattern 41 of the semiconductor package 10C was copper was performed. For convenience, the package is referred to as a semiconductor package 10D.

As simulation conditions, the planar shapes of the semiconductor packages 10C and 10D were set to rectangular shapes of 12 mm×12 mm, respectively, and total thicknesses of the semiconductor packages 10C and 10D were 400 μm. Moreover, the planar shape of the semiconductor chip 20, which was embedded in the insulating layer 33, was a rectangular shape of 8 mm×8 mm, and the total thickness of the semiconductor chip 20 was 75 μm. In addition, the material of the semiconductor chip 20 was silicon, the material of each insulating layer was epoxy resin, and the material of each wiring layer except for the wiring pattern 41 of the wiring layer 40 was copper.

In addition, the thicknesses (the thickness of the thickest portion) of each layer were set as follows. The thickness of the insulating layer 33 was set to 120 μm, the thickness of the insulating layer 35 was set to 45 μm, the thickness of the newly inserted insulating layer was set to 45 μm, the thickness of the insulating layer 37 was set to 55 μm, the thickness of the solder-resist layer 48 was set to 51 μm, the thickness of the wiring pattern of each wiring layer except for the wiring layer 40 was 15 μm, and the thickness of the wiring pattern 41 was 30 μm.

The warpage when the rear surface side of the semiconductor chip 20 is convexly warped is set to plus, the warpage when the rear surface side of the semiconductor chip 20 is concavely warped is set to minus, and the simulation results are shown in Table 1.

TABLE 1

|  | Semiconductor Package 10C | Semiconductor Package 10D |
|---|---|---|
| Main Component of Wiring Pattern 41 | 42 alloy | Copper |
| Thermal expansion coefficient [ppm/° C.] | Substantially 4.5 | Substantially 17.2 |
| Warpage of the Entire Package [μm] | 81.6 | 193.9 |
| Warpage of Chip Mounting Area [μm] | −78.2 | −134.8 |

Figure 8:
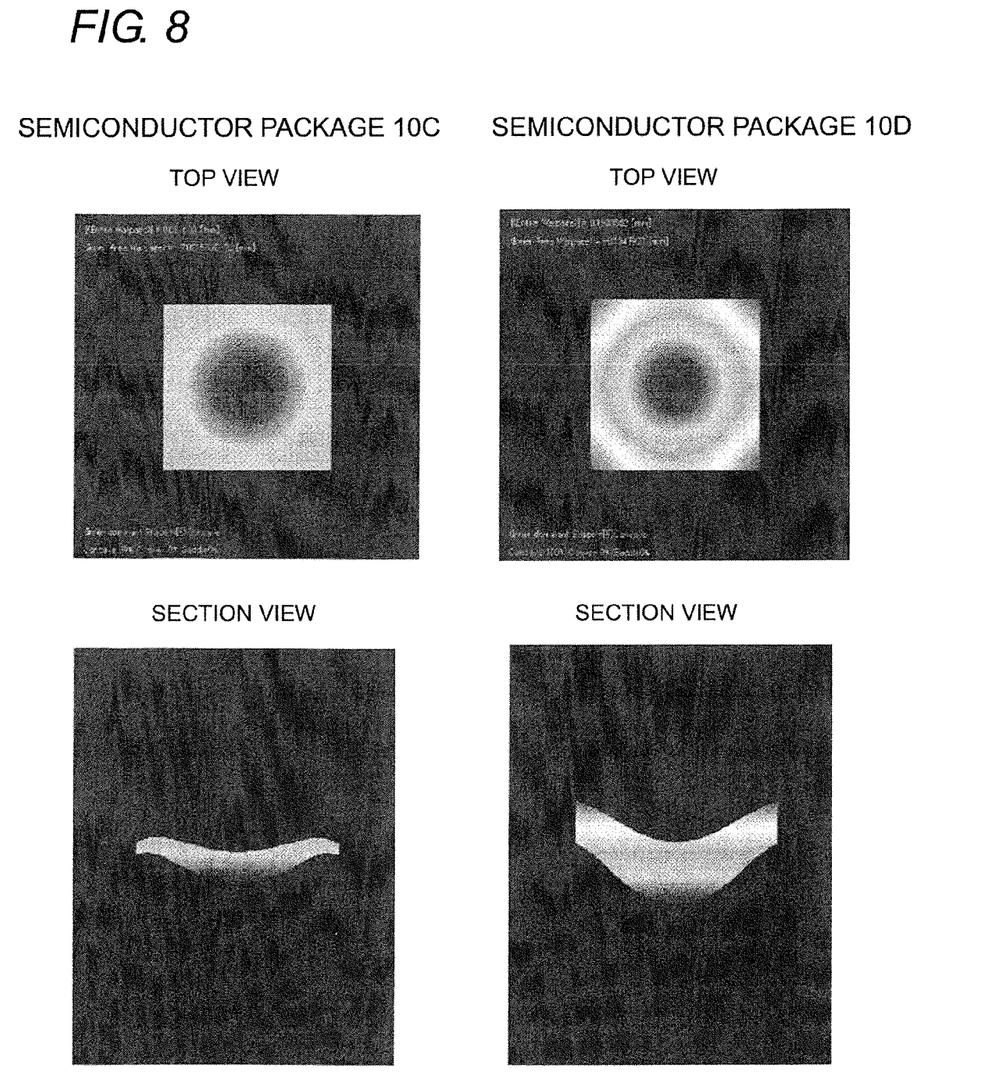
FIG. 8 shows a simulation result of the warpage occurred in the semiconductor packages 10C and 10D, respectively, wherein the simulation result includes top-view images and section-view images of the warped semiconductor packages 10C and 10D.

As shown in Table 1, compared to the semiconductor package 10D which had copper as the main component of the wiring pattern 41, in the semiconductor package 10C which had the 42 alloy as the main component of the wiring pattern 41, it was confirmed that the warpage could be decreased in the entire package and all chip mounting areas. In addition, even though the thickness of the wiring pattern 41 was 30 μm, it was confirmed that the warpage could be decreased. Moreover, it is expected that the warpage can be further decreased by setting the thickness of the wiring pattern 41 to be more than 30 μm. As shown in FIG. 8, in simulation images (top view) of the semiconductor packages 10C and 10D, a dark portion represents that the degree of warpage is large.

As described above, the preferred embodiment and the modifications are described in detail. However, the present invention is not limited to the above-described embodiment and the modifications, and various modifications and replacements are applied to the above-described embodiment and the modifications without departing from the scope of claims.

For example, in the first embodiment, the first electrode pad 30 may not be provided. That is, when it is unnecessary to provide the plurality of semiconductor packages, the electrode pad may be provided on one side.

What is claimed is:
1. A semiconductor package comprising:
a semiconductor chip comprising:
a first surface on which a first electrode pad is provided;
a second surface opposite to the first surface; and
a side surface between the first surface and the second surface,
a first insulating layer comprising a first surface and a second surface opposite to the first surface, wherein the semiconductor chip is embedded in the first insulating layer such that the first surface and the side surface of the semiconductor chip are covered by the first insulating layer;
a wiring structure on the first surface of the first insulating layer and comprising an insulating layer and a wiring layer;
an outermost wiring layer on the wiring structure and comprising:
a reinforcing wiring pattern including a plurality of layers comprising at least three planar layers; and
a via wiring which penetrates each of the layers in the plurality of layers of the reinforcing wiring pattern and electrically connected to the reinforcing wiring pattern, wherein the via wiring is formed through the insulating layer of the wiring structure and electrically connected to the wiring layer of the wiring structure;

a second insulating layer on the wiring structure to cover the outermost wiring layer, wherein a thermal expansion coefficient of a main component of the reinforcing wiring pattern is between a thermal expansion coefficient of a main component of the wiring layer of the wiring structure and a thermal expansion coefficient of a main component of the semiconductor chip.

2. The semiconductor package according to claim 1, wherein the plurality of planar layers of the reinforcing wiring pattern comprises:
a first planar layer having an upper surface and a lower surface opposite to the upper surface; and
second planar layers covering the upper and lower surfaces of the first layer, respectively,
wherein a thermal expansion coefficient of the first layer is between the thermal expansion coefficient of the main component of the wiring layer of the wiring structure and the thermal expansion coefficient of the main component of the semiconductor chip, and
wherein the second planar layers are formed of a different material from the first layer.

3. The semiconductor package according to claim 2, wherein
a main component of the second layer is the same as the main component of the wiring layer of the wiring structure.

4. The semiconductor package according to claim 1, wherein
the outermost wiring layer further comprises another wiring pattern disposed around the reinforcing wiring pattern, wherein a main component of the another wiring pattern is the same as the main component of the wiring layer of the wiring structure, and
the reinforcing wiring pattern faces the semiconductor chip via the wiring structure in a thickness direction of the semiconductor package.

5. The semiconductor package according to claim 1, further comprising:
a second electrode pad embedded in the first insulating layer to be exposed from the second surface of the first insulating layer, and
wherein a thermal expansion coefficient of a main component of the second electrode pad is between the thermal expansion coefficient of the main component of the wiring layer of the wiring structure and the thermal expansion coefficient of the main component of the semiconductor chip.

6. The semiconductor package according to claim 5, wherein the surface of second electrode pad is flush with the second surface of the first insulating layer, and
the second surface of the semiconductor chip is flush with the second surface of the first insulating layer.

7. The semiconductor package according to claim 1, wherein
the first electrode pad is electrically connected to the wiring layer of the wiring structure, and
the reinforcing wiring pattern is electrically connected to the first electrode pad through the via wiring and the wiring layer of the wiring structure.

8. The semiconductor package according to claim 1, wherein
a portion of the reinforcing wiring pattern is exposed from the second insulating layer, and an external connection pad is provided on the exposed portion of the reinforcing wiring pattern.

9. A semiconductor package comprising:
a semiconductor chip comprising:
a first surface on which a first electrode pad is provided;
a second surface opposite to the first surface; and
a side surface between the first surface and the second surface,
a first insulating layer comprising a first surface and a second surface opposite to the first surface, wherein the semiconductor chip is embedded in the first insulating layer such that the first surface and the side surface of the semiconductor chip are covered by the first insulating layer;
a wiring structure on the first surface of the first insulating layer and comprising an insulating layer and a wiring layer;
an outermost wiring layer on the wiring structure and comprising:
a reinforcing wiring pattern including a plurality of planar layers; and
a via wiring which penetrates the plurality of planar layers of the reinforcing wiring pattern and electrically connected to the reinforcing wiring pattern, wherein the via wiring is formed through the insulating layer of the wiring structure and electrically connected to the wiring layer of the wiring structure;
a second insulating layer on the wiring structure to cover the outermost wiring layer, wherein a thermal expansion coefficient of a main component of the reinforcing wiring pattern is between a thermal expansion coefficient of a main component of the wiring layer of the wiring structure and a thermal expansion coefficient of a main component of the semiconductor chip,
wherein the plurality of planar layers of the reinforcing wiring pattern comprises:
a first planar layer having an upper surface and a lower surface opposite to the upper surface; and
a second planar layer formed on and covering one of the upper and lower surfaces of the first layer,
wherein a thermal expansion coefficient of the first layer is between the thermal expansion coefficient of the main component of the wiring layer of the wiring structure and the thermal expansion coefficient of the main component of the semiconductor chip, and
wherein the second layer is formed of a different material from the first layer.

10. The semiconductor package according to claim 9, wherein
the plurality of planar layers further comprises a third planar layer formed on and covering the other of the upper and lower surfaces of the first layer, and
the material of the second layer is the same as that of the third layer.

* * * * *